United States Patent
Cui et al.

(10) Patent No.: US 6,347,385 B1
(45) Date of Patent: Feb. 12, 2002

(54) INTERLEAVERS FOR TURBO CODE

(75) Inventors: Jian Cui, Nepean; Tong Wen; Rui Wang, both of Ottawa, all of (CA); Mikhail Bakulin, Moscow (RU); Alexander Shloma, Moscow (RU); Vitally Kreyndelin, Moscow (RU); Yuri Shinakov, Moscow (RU)

(73) Assignee: Nortel Networks Limited, Quebec (CA)

( * ) Notice: Subject to any disclaimer, the term of this patent is extended or adjusted under 35 U.S.C. 154(b) by 0 days.

(21) Appl. No.: 09/196,461

(22) Filed: Nov. 19, 1998

Related U.S. Application Data

(60) Provisional application No. 60/095,085, filed on Aug. 3, 1998.

(51) Int. Cl.[7] .............................................. G06F 11/00
(52) U.S. Cl. ...................................................... 714/701
(58) Field of Search ................................ 714/701, 702; 341/81

(56) References Cited

U.S. PATENT DOCUMENTS

| | | | |
|---|---|---|---|
| 4,394,642 A | 7/1983 | Currie et al. ................. 341/81 |
| 4,742,517 A * | 5/1988 | Takagi et al. ................. 714/702 |
| 5,136,588 A | 8/1992 | Ishijima ....................... 714/701 |
| 5,483,541 A | 1/1996 | Linsky ......................... 714/701 |
| 5,764,649 A * | 6/1998 | Tong ........................... 714/701 |
| 6,035,427 A * | 3/2000 | Kweon ......................... 714/702 |
| 6,151,690 A * | 11/2000 | Peeters ........................ 714/701 |

FOREIGN PATENT DOCUMENTS

| | | |
|---|---|---|
| EP | 0 235 477 A1 | 9/1987 |
| EP | 0 511 141 A1 | 10/1992 |
| EP | 0 627 821 A1 | 12/1994 |
| WO | WO 97/05702 | 2/1997 |
| WO | WO 98/16930 | 4/1998 |

* cited by examiner

Primary Examiner—Albert Decady
Assistant Examiner—Shelby A. Chase
(74) Attorney, Agent, or Firm—Cobrin & Gittes

(57) ABSTRACT

Systems and methods for interleaving codes includes a processor that acts on a data frame received and stored in a memory. The processor separates portions of the data frame and permutes the portions, achieving maximum data scattering by using equations based on number theory.

34 Claims, 4 Drawing Sheets

INTERLEAVERS FOR TURBO CODE

REFERENCE TO COPENDING PATENT APPLICATION

This is a utility patent application claiming priority from provisional application Serial No. 60/095,085 filed on Aug. 3, 1998.

FIELD OF THE INVENTION

This invention relates to the field of electronic communications systems and, more particularly, to interleavers for performing code modulation.

BACKGROUND OF THE INVENTION

Techniques for encoding communication channels, known as coded modulation, have been found to improve the bit error rate (BER) of electronic communication systems such as modem and wireless communication systems. Turbo coded modulation has proven to be a practical, power-efficient, and bandwidth-efficient modulation method for "random-error" channels characterized by additive white Gaussian noise (AWGN) or fading. These random-error channels can be found, for example, in the code division multiple access (CDMA) environment.

The key innovation of turbo codes is an interleaver which permutes the original received or transmitted data frame before input to a second encoder. Permuting is accomplished by a processor performing a randomizing algorithm, the construction of which is well known. Combining the permuted data frames with the original data frames has shown to achieve low bit-error rates in AWGN and fading channels. The interleaving process increases the diversity in the data in such a way that if the modulated symbol is distorted in transmission the error may be recoverable with the use of error correcting algorithms in the decoder.

A conventional interleaver collects, or frames, the signal points to be transmitted into a matrix, where the matrix is sequentially filled up a row at a time. After a predefined number of signal points have been framed, the interleaver is emptied by sequentially reading out the columns of the matrix for transmission. As a result, signal points in the same row of the matrix that were near each other in the original signal point flow are separated by a number of signal points equal to the number of rows in the matrix. Ideally, the number of columns and rows would be picked such that interdependent signal points, after transmission, would be separated by more than the expected length of an error burst for the channel. However, this may not be practicable. As the number of rows is increased, so is the signal delay due to the framing of the signal points. As a result, there is a system constraint on the size of the interleaver in order to keep the signal delay within acceptable limits. On the other hand, constraining the size of the interleaver limits the separation of the time-diverse interdependent signal points and thus limits the improvement in error performance achieved by the interleaver.

There are two conventional interleaving methods; uniform interleaving (i.e. a regular interleaving pattern); and non-uniform interleaving (i.e. a pseudo-irregular interleaving pattern). In the case of uniform interleaving, finite code words (FC) of higher weight can be constructed from FCs of lower weight. Therefore a certain "repetitive pattern" of low-weight FC output sequences can occur in the output stream of a uniform-interleaving turbo coder. However, uniform interleaving does not sufficiently de-correlate the output of the two encoders, hence the minimum distance of the resulting turbo code does not increase as one might expect.

On the other hand, non-uniform interleaving achieves better "maximum scattering" of data and "maximum disorder" of the output sequence, which means that the redundancy introduced by the two convolutional codes is more equally spread in the output sequence of the turbo encoder. The minimum distance is increased to much higher values than for uniform interleaving. A persistent problem for non-uniform interleaving is how to achieve sufficient "non-uniformity", since the interleaving algorithms can only be based on pseudo-irregular patterns. Besides this, the effort for implementing the scheme should be reasonable for practical applications. Furthermore, conventional interleavers require a significant amount of memory in the encoder. Conventional interleaving matrices also require delay compensations, which limit their use for applications with real-time requirements.

Accordingly there exists a need for systems and methods of interleaving codes that improve non-uniformity.

There also exists a need for systems and methods of interleaving codes that require minimal delay compensations.

It is thus an object of the present invention to provide systems and methods of interleaving codes that improve non-uniformity.

It is also an object of the present invention to provide systems and methods of interleaving codes that require minimal delay compensations.

SUMMARY OF THE INVENTION

In accordance with the teachings of the present invention, these and other objects may be accomplished by the present invention, which interleaves a data frame, where the data frame has a predetermined size and is made up of portions. An embodiment of the invention includes a memory configured to receive and store the data frame. Once received, the data frame is indexed by a plurality of rows having a predetermined row size and a plurality of columns having a predetermined column size. The product of the predetermined row size and the predetermined column size equals the predetermined size of the data frame.

A processor is coupled to the memory and used for separating the data frame into a plurality of portions. The processor also is used for generating a permuted sequence of the plurality of portions which are indexed by the plurality of rows in accordance with $i_1(n_1) = \alpha_1^{\wedge}(n_1) \mod(P_1)$, where $P_1$ is a prime number greater than the predetermined row size, where $n_1$ is an integer in the range of 1 through and including $P_1-1$, and where $\alpha_1$ is a root of $P_1$. This algorithm enables $i_1(n_1)$ to be a unique number between 1 and the predetermined row size.

The processor is also configured to generate a permuted sequence of the plurality of portions indexed by the plurality of columns in accordance with $i_2(n_2) = \alpha_2^{\wedge}(n_2) \mod(P_2)$, where $P_2$ is a prime number greater than the predetermined column size, where $n_2$ is an integer in the range of 1 through and including $P_2-1$, and where $\alpha_2$ is a root of $P_2$. This algorithm enables $i_2(n_2)$ to be a unique number between 1 and the predetermined column size. The result is interleaved portions of the dataframe.

BRIEF DESCRIPTION OF THE DRAWINGS

The invention will be more clearly understood by reference to the following detailed description of an exemplary embodiment in conjunction with the accompanying drawings, in which.

DETAILED DESCRIPTION OF THE INVENTION

The present invention is an apparatus and method for interleaving codes. The interleaver takes each incoming data frame of N data bits and rearranges them in a pseudo-random fashion prior to encoding by a second encoder. This invention can be used in satellite communication systems, wireless telephone systems, modems, computers, and the like.

Figure 1:
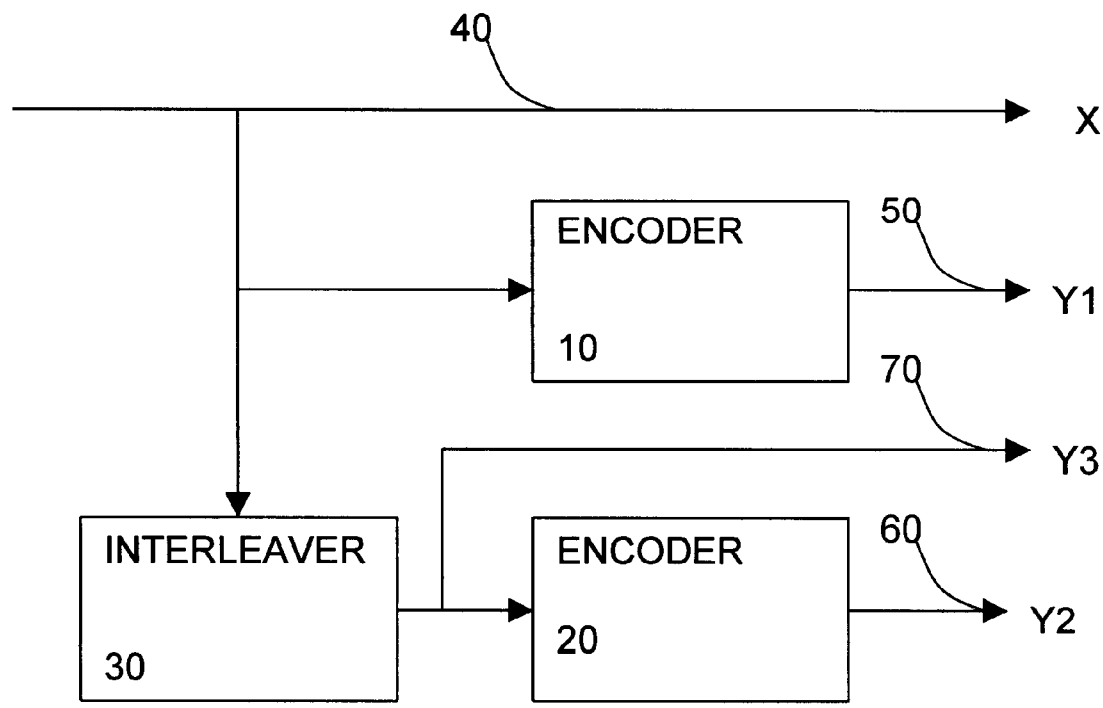
FIG. 1 is a diagram of a typical turbo encoder.

The interleaver sorts the bits in a manner that lacks any apparent order. The present invention will perform better than conventional interleavers even if the data frame is small (i.e., N on the order of a few thousand). This is accomplished by obtaining more diverse "scattering" than conventional interleavers. FIG. 1 depicts a standard turbo encoder. It consists of two encoders 10 and 20 and an interleaver 30. The encoders 10 and 20 are arranged in a parallel concatenation with the interleaver 30 before the second encoder 20. The output of the first encoder 10 is a low-weight code 50 and the output of the second encoder 20 is a high-weight code 60. These outputs may go to a device such as a code puncturing mechanism (not shown) to periodically delete selected bits to reduce coding overhead. In addition the output of the interleaver 70 may also be transmitted directly to the puncturing mechanism, but it is not necessary. In addition the present invention may also be used with other non turbo code systems that require code interleaving.

The present invention discloses two embodiments of an interleaver which can improve the performance of conventional turbo codes. The first embodiment will be referred to as a Galya interleaver and the second embodiment will be referred to as a frequency hopping (FH) interleaver. Both of these embodiments are based on number theory and both of these embodiments may be realized in software or hardware (i.e. application specific integrated circuits (ASIC), programmable logic arrays (PLA), or any other suitable logic devices, the construction of which is well known).

In the first embodiment, the Galya interleaver, the information bit matrix has $N_1$ rows and $N_2$ columns such that $N_1*N_2=N$. Further, there exist prime numbers $P_1$ and $P_2$ which are respectively greater than $N_1$ and $N_2$ (i.e. $P_1>N_1$ and $P_2>N_2$). It is preferred that these prime numbers should be the lowest prime numbers greater than $N_1$ and $N_2$, respectively, but it is not required. Initial roots $\alpha_1$ and $\alpha_2$ may be determined for these prime numbers using conventional methods. Employing the above noted parameters, the bit sequence generation for the Galya interleaver is defined by the following equations:

$$i_1(n_1)=\alpha_1^{\hat{}}(n_1)\bmod(P_1), \text{ wherein } n_1=1,2,\ldots,P_1-1; \text{ and } i_1(n_1)\leq N_1; \text{ and,}$$

$$i_2(n_2)=\alpha_2^{\hat{}}(n_2)\bmod(P_2), \text{ wherein } n_2=1,2,\ldots,P_2-1; \text{ and } i_2(n_2)\leq N_2.$$

For N=256, we have $N_1=N_2=16$, $P_1=P_2=17$, $\alpha_1=\alpha_2=3$.

Figure 2A:
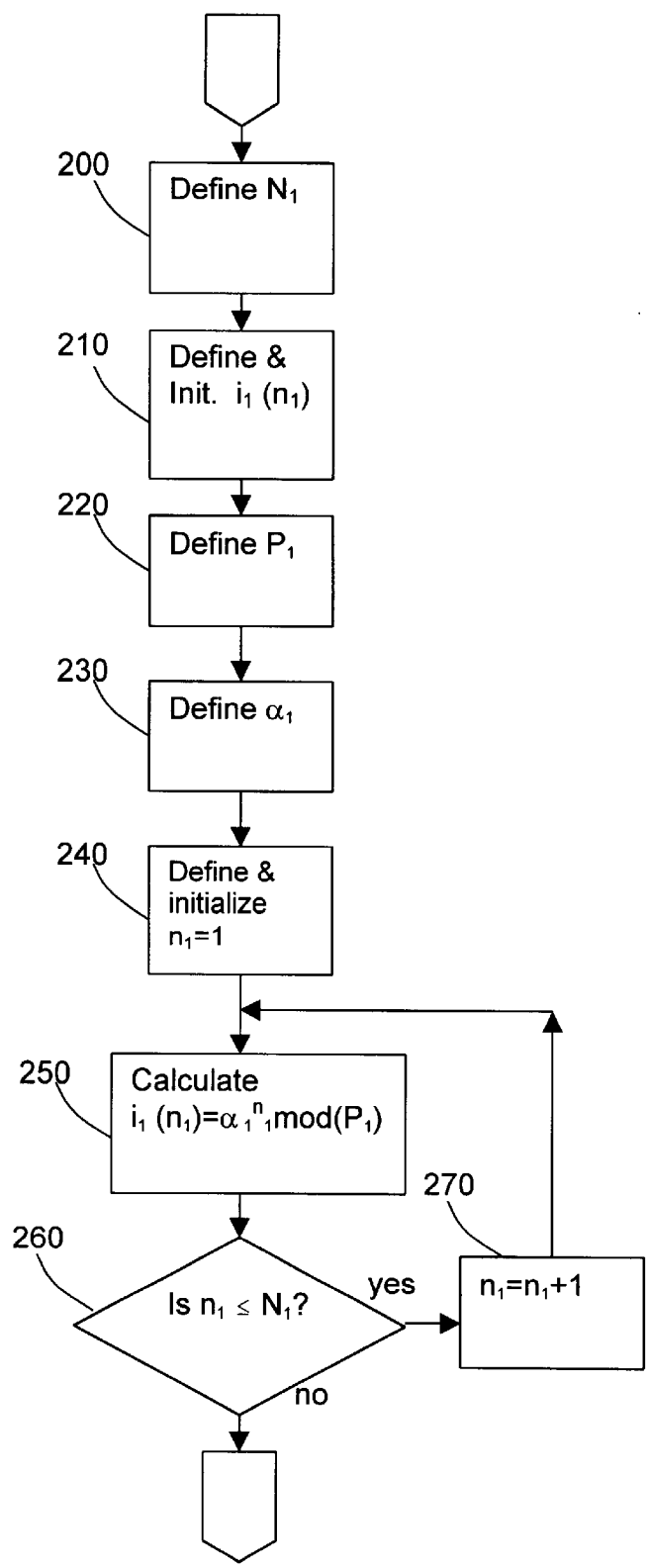
FIGS. 2a and 2b are flowchart diagrams illustrating the operation of the improved interleaver for turbo codes in accordance with the present invention.
Figure 2B:
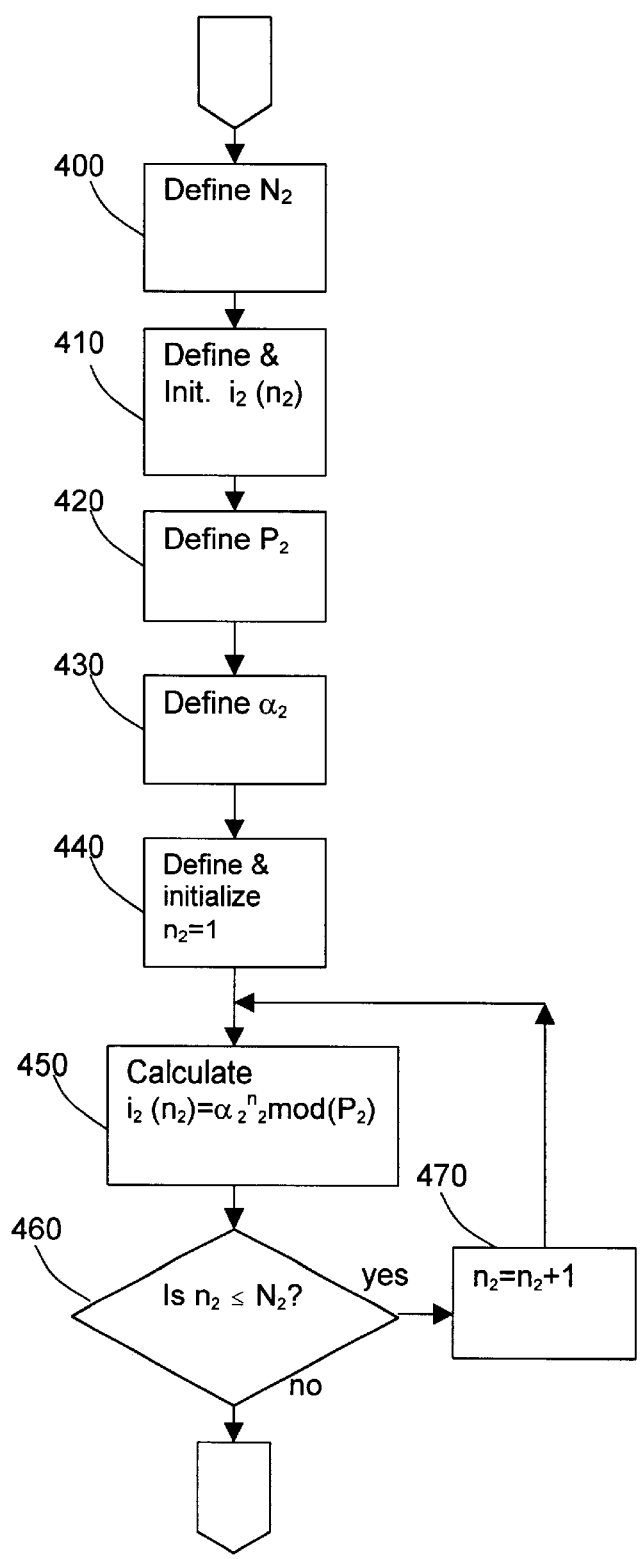

FIGS. 2a and 2b show the implementation of the above embodiment in either software or hardware. The above equations may be performed in a parallel or serial manner. In FIG. 2a, step 200 defines a parameter representing block length $N_1$. An array $i_1(n_1)$ for storing the bit sequence is defined (step 210) to size $N_1$ and initialized. Next, a prime number $P_1$ is defined (step 220) which is greater than $N_1$. Step 230 defines the initial root of $N_1$ called $\alpha_1$. A counter $n_1$ is defined and initialized to one (step 240) and incremented (step 270) for each pass of the loop. As step 260 shows, the counter determines when to break out of a loop which calculates (step 250) the bit sequence, $i_1(n_1)$, for each symbol in the data frame. The loop is conditioned to break when the entire data frame has been permuted. The loop can also be adjusted to interleave a portion of the received or transmitted data frames.

In FIG. 2b, step 400 defines a parameter representing block length $N_2$. An array for storing the bit sequence is defined (step 410) to size $N_2$ and initialized. Next, a prime number $P_2$ is defined (step 420) which is greater than $N_2$. Step 430 defines the initial root of $N_2$ called $\alpha_2$. A counter $n_2$ is defined and initialized to one (step 440) and incremented (step 470) for each pass of the loop. As step 460 shows, the counter determines when to break out of a loop which calculates (step 450) the bit sequence, $i_2(n_2)$, for each symbol in the data frame. The loop is conditioned to break when the entire data frame has been permuted. The loop can also be adjusted to interleave a portion of the received or transmitted data frames.

In the second embodiment, the FH interleaver, assume that the block length (or data frame size) is length N. Further, there exists a prime number P which is greater than N. It is preferred that the prime number should be the lowest prime number greater than N, but it is not required. For a given prime number it is possible to find an initial root a using conventional methods. Thus, for example, if N=256, then P=257 and α=3. Employing the above noted parameters, the bit sequence generation for the FH interleaver is defined by the following equation:

$$i(n)=\alpha^{\hat{}}(n)\bmod(P), \text{ wherein } n=1,2,\ldots,P-1, i(n)\leq N.$$

Figure 3:
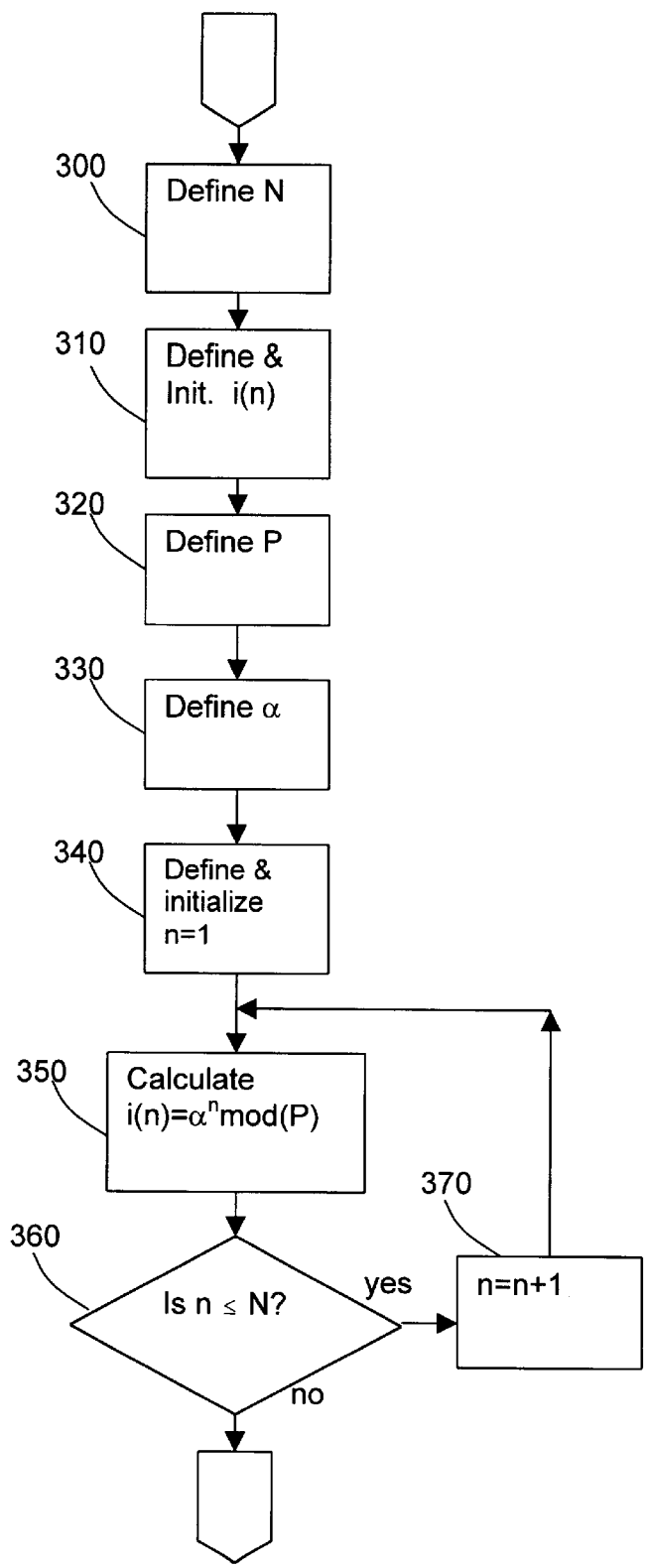
FIG. 3 is a flow chart diagram illustrating another embodiment of the improved interleaver for turbo codes in accordance with the present invention.

FIG. 3 is an implementation of the above embodiment in either software or hardware. Step 300 defines a parameter representing block length N. An array for storing the bit sequence is defined (step 310) to size N and initialized. Next, a prime number P is defined (step 320) which is greater than N. Step 330 defines the initial root of N called α. A counter n is defined and initialized to one (step 340) and incremented (step 370) for each pass of the loop. As step 360 shows, the counter determines when to break out of a loop which calculates (step 350) the bit sequence, i(n), for each symbol in the data frame. The loop is conditioned to break when the entire data frame has been permuted. The loop can be adjusted to interleave a portion of the received or transmitted data frames.

Those skilled in the art will realize that any initialization value for the array i(n), $i_1(n_1)$, $i_2(n_2)$ can be used and still be within the scope of the invention. For example the initialization data can consist of zeros, ones, twos, etc., or a template may be created with different initialization data. In addition, it is common in programming to use indexes of different starting values. Thus, n, $n_1$, and $n_2$ can be any integer and the loop break conditions $n\leq N$, $n_1\leq N_1$, and $n_2\leq N_2$ can be adjusted accordingly and still be within the scope of this invention.

The disclosed interleavers are compatible with existing turbo codes structure and are compatible with the current decoding algorithm. These interleavers offer superior performance without increasing system complexity.

In addition, those skilled in the art will realize that de-interleavers can be used to decode the interleaved data frames. The construction of de-interleavers used in decoding turbo codes is also well known in the art. As such they are not further discussed herein. Accordingly, a de-interleaver corresponding to the first embodiment can be constructed using the permuted sequences:

$i_1(n_1) = \alpha_1\hat{}(n_1) \mod(P_1)$, wherein $n_1 = 1, 2, \ldots, P_1-1$; and $i_1(n_1) \leq N_1$; and, $i_2(n_2) = \alpha_2\hat{}(n_2) \mod(P_2)$, wherein $n_2 = 1, 2, \ldots, P_2-1$; and $i_2(n_2) \leq N_2$ for deinterleaving. It follows, a de-interleaver corresponding to the second embodiment can also be constructed using the permuted sequence:

$i(n) = \alpha\hat{}(n) \mod(P)$, wherein $n = 1, 2, \ldots, P-1$, $i(n) \leq N$ for deinterleaving.

It will thus be seen that the invention efficiently attains the objects set forth above, among those made apparent from the preceding description. In particular, the invention provides systems and methods of interleaving codes.

It will be understood that changes may be made in the above construction and in the foregoing sequences of operation without departing from the scope of the invention. It is accordingly intended that all matter contained in the above description or shown in the accompanying drawings be interpreted as illustrative rather than in a limiting sense.

It is also to be understood that the following claims are intended to cover all of the generic and specific features of the invention as described herein, and all statements of the scope of the invention which, as a matter of language, might be said to fall therebetween.

Having described the invention, what is claimed as new and secured by letters patent is:

1. An apparatus for interleaving a plurality of portions of a data frame having a predetermined size, comprising:

a memory configured to receive and store said data frame indexed by a plurality of rows having a predetermined row size and a plurality of columns having a predetermined column size, wherein the product of said predetermined row size and said predetermined column size equals said predetermined size of said data frame;

a processor coupled to said memory for separating said data frame into said plurality of portions and for generating a permuted sequence of said plurality of portions indexed by said plurality of rows in accordance with $i_1(n_1) = \alpha_1\hat{}(n_1) \mod(P_1)$, wherein $P_1$ is a prime number greater than said predetermined row size, wherein $n_1$ is an integer in the range of 1 through and including $P_1-1$, and wherein $\alpha_1$ is a root of $P_1$ which enables $i_1(n_1)$ to be a unique number between 1 and said predetermined row size; and said processor configured to generate a permuted sequence of said plurality of portions indexed by said plurality of columns in accordance with $i_2(n_2) = \alpha_2\hat{}(n_2) \mod(P_2)$, wherein $P_2$ is a prime number greater than said predetermined column size, wherein $n_2$ is an integer in the range of 1 through and including $P_2-1$, and wherein $\alpha_2$ is a root of $P_2$ which enables $i_2(n_2)$ to be a unique number between 1 and said predetermined column size, whereby portions of said data frame are interleaved.

2. The apparatus according to claim 1, wherein said plurality of portions have a predetermined size, wherein said predetermined size is at least one bit.

3. The apparatus according to claim 1, wherein said processor is an application specific integrated circuit (ASIC).

4. The apparatus according to claim 1, further comprising a de-interleaver, wherein said de-interleaver deinterleaves said plurality of portions indexed by said plurality of rows in accordance with said permuted sequence $i_1(n_1) = \alpha_1\hat{}(n_1) \mod(P_1)$.

5. The apparatus according to claim 1, further comprising a de-interleaver, wherein said de-interleaver deinterleaves said plurality of portions indexed by said plurality of columns in accordance with said permuted sequence $i_2(n_2) =_2\hat{}(n_2) \mod(P_2)$.

6. An apparatus for interleaving a plurality of portions of a data frame having a predetermined size, comprising:

a memory configured to receive and store said data frame; and a processor coupled to said memory for separating said data frame into said plurality of portions and for generating a permuted sequence of said plurality of portions in accordance with $i(n) = \alpha^n \mod(P)$, wherein $P$ is a prime number greater than said predetermined size of said data frame, wherein $n$ is an integer in the range of 1 through and including $P-1$, and wherein $\alpha$ is a root of $P$ which enables $i(n)$ to be a unique number between 1 and said predetermined size of said data frame, whereby portions of said data frame are interleaved.

7. The apparatus according to claim 6, wherein said plurality of portions have a predetermined size, wherein said predetermined size is at least one bit.

8. The apparatus according to claim 6, wherein said processor is an application specific integrated circuit (ASIC).

9. The apparatus according to claim 6, further comprising a de-interleaver, wherein said de-interleaver deinterleaves said plurality of portions in accordance with said permuted sequence.

10. A method for interleaving a plurality of portions of a data frame having a predetermined size, comprising:

receiving and storing said data frame;

indexing said data frame by a plurality of rows having a predetermined row size and a plurality of columns having a predetermined column size, wherein the product of said predetermined row size and said predetermined column size equals said predetermined size of said data frame;

separating said data frame into said plurality of portions;

permuting said plurality of portions indexed by said plurality of rows in accordance with $i_1(n_1) = \alpha_1\hat{}(n_1) \mod(P_1)$, wherein $P_1$ is a prime number greater than said predetermined row size, wherein $n_1$ is an integer in the range of 1 through and including $P_1-1$, and wherein $\alpha_1$ is a root of $P_1$ which enables $i_1(n_1)$ to be a unique number between 1 and said predetermined row size; and permuting said plurality of portions indexed by said plurality of columns in accordance with $i_2(n_2) = \alpha_2\hat{}(n_2) \mod(P_2)$ wherein $P_2$ is a prime number greater than said predetermined column size, wherein $n_2$ is an integer in the range of 1 through and including $P_2-1$ and wherein $\alpha_2$ is a root of $P_2$ which enables $i_2(n_2)$ to be a unique number between 1 and said predetermined column size, whereby portions of said data frame are interleaved.

11. The method according to claim 10, wherein said plurality of portions have a predetermined size, wherein said predetermined size is at least one bit.

12. The method according to claim 10, wherein said permuting is accomplished by using an application specific integrated circuit (ASIC).

13. The method according to claim 10, wherein said permuting is accomplished by using a microprocessor.

14. The method according to claim 10, wherein said permuting is accomplished by using software.

15. The method according to claim 10, further comprising deinterleaving said plurality of portions indexed by said plurality of rows in accordance with said permuted sequence $i_1(n_1)=\alpha_1^{\hat{}}(n_1)\mathrm{mod}(P_1)$.

16. The method according to claim 10, further comprising deinterleaving said plurality of portions indexed by said plurality of columns in accordance with said permuted sequence $i_2(n_2)=\alpha_2^{\hat{}}(n_2)\mathrm{mod}(P_2)$.

17. A method for interleaving a plurality of portions of a data frame having a predetermined size, comprising:

receiving and storing said data frame;

separating said data frame into said plurality portions;

permuting said plurality of portions in accordance with $i(n)=\alpha^n\mathrm{mod}(P)$, wherein P is a prime number greater than said predetermined size of said data frame, wherein n is an integer in the range of 1 through and including P−1, and wherein α is a root of P which enables i(n) to be a unique number between 1 and said predetermined size of said data frame.

18. The method according to claim 17, wherein said plurality of portions have a predetermined size, wherein said predetermined size is at least one bit.

19. The method according to claim 17, wherein said permuting is accomplished by using an application specific integrated circuit (ASIC).

20. The method according to claim 17, wherein said permuting is accomplished by using a microprocessor.

21. The method according to claim 17, wherein said permuting is accomplished by using software.

22. An apparatus for interleaving a plurality of portions of a data frame having a predetermined size, comprising:

means for receiving and storing said data frame;

means for indexing said data frame by a plurality of rows having a predetermined row size and a plurality of columns having a predetermined column size, wherein the product of said predetermined row size and said predetermined column size equals said predetermined size of said data frame;

means for separating said data frame into said plurality of portions;

means for permuting said plurality of portions indexed by said plurality of rows in accordance with $i_1(n_1)=\alpha_1^{\hat{}}(n_1)\mathrm{mod}(P_1)$, wherein $P_1$ is a prime number greater than said predetermined row size, wherein $n_1$ is an integer in the range of 1 through and including $P_1-1$ and wherein $\alpha_1$ is a root of $P_1$ which enables $i_1(n_1)$ to be a unique number between 1 and said predetermined row size; and means for permuting said plurality of portions indexed by said plurality of columns in accordance with $i_2(n_2)=\alpha_2^{\hat{}}(n_2)\mathrm{mod}(P_2)$, wherein $P_2$ is a prime number greater than said predetermined column size, wherein $n_2$ is an integer in the range of 1 through and including $P_2-1$, and wherein $\alpha_2$ is a root of $P_2$ which enables $i_2(n_2)$ to be a unique number between 1 and said predetermined column size.

23. The apparatus according to claim 22, wherein said plurality of portions have a predetermined size, wherein said predetermined size is at least one bit.

24. The apparatus according to claim 22, wherein said means for permuting is accomplished by using an application specific integrated circuit (ASIC).

25. The apparatus according to claim 22, wherein said means for permuting is accomplished by using a microprocessor.

26. The method according to claim 22, wherein said means for permuting is accomplished by using software.

27. The method according to claim 22, further comprising de-interleaver means for deinterleaving said plurality of portions indexed by said plurality of rows in accordance with said permuted sequence $i_1(n_1)=\alpha_1^{\hat{}}(n_1)\mathrm{mod}(P_1)$.

28. The method according to claim 22, further comprising de-interleaver means for deinterleaving said plurality of portions indexed by said plurality of columns in accordance with said permuted sequence $i_2(n_2)=\alpha_2^{\hat{}}(n_2)\mathrm{mod}(P_2)$.

29. An apparatus for interleaving a plurality of portions of a data frame having a predetermined size, comprising:

means for receiving and storing said data frame;

means for separating said data frame into said plurality portions; and means for permuting said plurality of portions in accordance with $i(n)=\alpha^n\mathrm{mod}(P)$, wherein P is a prime number greater than said predetermined size of said data frame, wherein n is an integer in the range of 1 through and including P−1, and wherein α is a root of P which enables i(n) to be a unique number between 1 and said predetermined size.

30. The apparatus according to claim 29, wherein said plurality of portions have a predetermined size, wherein said predetermined size is at least one bit.

31. The apparatus according to claim 29, wherein said means for permuting is accomplished using an application specific integrated circuit (ASIC).

32. The apparatus according to claim 29, wherein said means for permuting is accomplished using a microprocessor.

33. The apparatus according to claim 29, wherein said permuting is accomplished using software.

34. The method according to claim 29, further comprising de-interleaver means for deinterleaving said plurality of portions in accordance with said permuted sequence.

* * * * *